US010658711B2

(12) United States Patent
Lorenz et al.

(10) Patent No.: US 10,658,711 B2
(45) Date of Patent: May 19, 2020

(54) TEMPERATURE SENSOR, BATTERY SYSTEM AND METHOD FOR FITTING A BATTERY SYSTEM

(71) Applicant: Robert Bosch GmbH, Stuttgart (DE)

(72) Inventors: Lisa Lorenz, Stuttgart (DE); Andreas Otto, Hoerselberg-Hainich (DE); Walter Jasch, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 58 days.

(21) Appl. No.: 16/095,393

(22) PCT Filed: Apr. 7, 2017

(86) PCT No.: PCT/EP2017/058347
§ 371 (c)(1),
(2) Date: Oct. 22, 2018

(87) PCT Pub. No.: WO2017/182293
PCT Pub. Date: Oct. 26, 2017

(65) Prior Publication Data
US 2019/0131671 A1    May 2, 2019

(30) Foreign Application Priority Data

Apr. 20, 2016    (DE) .................. 10 2016 206 666

(51) Int. Cl.
*H01M 10/48* (2006.01)
*H01M 10/613* (2014.01)
(Continued)

(52) U.S. Cl.
CPC .......... *H01M 10/486* (2013.01); *G01R 31/36* (2013.01); *H01M 10/613* (2015.04); *H05K 1/18* (2013.01);
(Continued)

(58) Field of Classification Search
USPC ....................................................... 320/150
See application file for complete search history.

(56) References Cited

U.S. PATENT DOCUMENTS 4,484,253 A * 11/1984 Roberts ..................... F21L 2/00
                                                                 200/60
2009/0139781 A1* 6/2009 Straubel ................. B60L 50/64
                                                                 180/65.1
(Continued)

FOREIGN PATENT DOCUMENTS

AT           89302         9/1922
DE         60219291        1/2008
(Continued)

OTHER PUBLICATIONS

International Search Report for Application No. PCT/EP2017/058347 dated Jun. 26, 2017 (English Translation, 2 pages).

*Primary Examiner* — Mohammed Alam
(74) *Attorney, Agent, or Firm* — Michael Best & Friedrich LLP

(57) ABSTRACT

The invention relates to a temperature sensor (5) for measuring a temperature of a battery system (1) for storing electrical energy and also for supplying an electric motor of a motor vehicle with electrical energy. The temperature sensor (5) has a sensor head (6) and connection wires (7) electrically coupled to the sensor head. At least one of the connection wires (7) is at least partially formed as a spring element (8) or forms at least part of a spring element (8), wherein the spring element (8) is formed as a helical spring or as twisted. The invention further relates to a battery system (1) with at least one temperature sensor (5) for measuring a temperature of at least one battery cell (3), wherein the temperature sensor (5) has at least one spring element (8), which is mechanically attached to a sensor head (6) of the temperature sensor (5) and is fastened to the (Continued)

battery management system (4) in such a way that the sensor head (6) is pressed by the spring element (8) onto a measuring point (9) on a battery unit (2) of the battery system (1). The invention also relates to a method for fitting such a battery system (1).

11 Claims, 3 Drawing Sheets

(51) Int. Cl.
    *G01R 31/36*     (2020.01)
    *H05K 1/18*     (2006.01)
    *H01M 2/10*     (2006.01)
    *H01M 10/625*     (2014.01)

(52) U.S. Cl.
    CPC ........ *H01M 2/1077* (2013.01); *H01M 10/625* (2015.04); *H01M 2220/20* (2013.01); *H05K 2201/10151* (2013.01)

(56) References Cited

U.S. PATENT DOCUMENTS

| | | | |
|---|---|---|---|
| 2015/0214583 A1* | 7/2015 | Lim | H01M 10/486 |
| | | | 429/90 |
| 2018/0115027 A1* | 4/2018 | Hammerschmied | |
| | | | H01M 10/4257 |
| 2019/0131671 A1* | 5/2019 | Lorenz | H01M 10/486 |

FOREIGN PATENT DOCUMENTS

| | | |
|---|---|---|
| DE | 102012222866 | 6/2014 |
| DE | 102013113799 | 6/2015 |
| EP | 2711675 | 3/2014 |
| JP | 09204939 | 8/1997 |
| JP | 2000028692 | 1/2000 |

\* cited by examiner

TEMPERATURE SENSOR, BATTERY SYSTEM AND METHOD FOR FITTING A BATTERY SYSTEM

BACKGROUND OF THE INVENTION

Battery systems, in particular Li-ion battery systems, are often used as energy storage devices for a drive motor in hybrid or electric vehicles. Known Li-ion battery systems comprise a plurality of Li-ion battery cells that are electrically connected to one another in series and/or in parallel. In order to ensure operational safety, battery systems of this type comprise a battery management system by means of which it is possible to monitor the battery cells or parameters of the battery cells, such as voltages, currents and charges.

In order to ensure an optimum performance and to ensure that the battery cells age as little as possible and to ensure a high degree of operational safety, it has been proven to monitor temperatures of battery systems and thus to be able to control in a closed-loop manner the operation of the battery system within a predetermined temperature range. In so doing, it is important to monitor the temperature of the individual battery cells. On the basis of the determined temperatures of the battery cells, it is possible to control in a closed-loop manner by way of example a cooling device for cooling the battery cells to an optimum working temperature. Moreover, the determined temperatures may be provided to the battery management system for predicting the performance of the battery cells on the basis of temperature-dependent battery cell parameters, such as by way of example internal resistances or current limits. Finally, due to the high chemical activity of lithium, it is particularly important in the case of Li-ion battery cells in order to ensure operational safety that the battery cells do not exceed a predetermined maximum temperature since the explosion risk is increased above the maximum temperature.

In practice, it has proven so as to reduce costs in the case of battery systems having a multiplicity of battery cells to monitor the temperature of only a few battery cells or at a few measuring sites in the battery system by means of temperature sensors. Accordingly, a good thermal connection of the temperature sensor to the measuring site and also an electrical coupling to the battery management system is to be taken into consideration for the integration of a temperature sensor in the battery system. It is possible to produce a thermal connection by way of example by means of mechanically pressing the temperature sensor against the measuring site or by means of attaching said temperature sensor for example by means of a soldering procedure, a welding procedure, screws or an adhesion procedure. In order to produce the electrical coupling, it is possible to use plug-in systems, to integrate flex-foils or to solder connection wires of the temperature sensor to the battery management system.

In the case of known battery systems, the procedure of integrating temperature sensors, in particular when producing an electrical coupling by means of a plug-in system, often incurs high costs. It is often necessary to perform a complex modification of the measuring site when mechanically connecting the temperature sensor to the measuring site, in particular when using screws, a soldering procedure or rivets. It is generally not possible in this case to provide a direct contact with the battery cell. Moreover, known temperature sensors are rigid or are essentially rigid with the result that it is necessary when integrating the temperature sensor to take into consideration even small deviations in a spacing between the measuring site and the site at which the temperature sensor is connected to the battery management system in order to ensure an optimum measurement of the temperature and by way of example to avoid a gap between the temperature sensor and the measuring site. Furthermore, battery systems are becoming increasingly more complex and often comprise a comparatively small installation space for temperature sensors with the result that it is necessary to use especially configured temperature sensors rather than those of a standard design. This likewise results in high production costs and also a high outlay with regard to the qualification expenses.

SUMMARY OF THE INVENTION

The present invention relates to a temperature sensor for measuring a temperature in a battery system, a battery system for storing electrical energy and for supplying an electric motor with electrical energy and also a method for mounting a battery system of this type. Further features and details of the invention are disclosed in the subordinate claims, the description and the drawings. In so doing, features and details apply that are described in connection with the temperature sensor in accordance with the invention, naturally also in connection with the battery system in accordance with the invention and the method in accordance with the invention and respectively conversely with the result that with regard to the disclosure reference is always made or it is always possible to refer to the individual aspects of the invention.

In accordance with a first aspect of the invention, a temperature sensor is provided for measuring a temperature in a battery system for storing electrical energy and for supplying an electric motor of a motor vehicle with electrical energy. The temperature sensor comprises a sensor head and connection wires are electrically coupled to the sensor head. It is preferred that the temperature sensor comprises two connection wires. At least one of the connection wires is configured at least in part as a spring element or forms at least one part of a spring element, wherein the spring element is configured in the shape of a helical spring or in a twisted manner.

The sensor head may be brought into contact with a measuring site of a battery system so as to measure the temperature. The connection wires may be electrically coupled to a battery management system of a battery system in such a manner that, in particular by means of a soldering procedure, temperatures that are recorded by the sensor head may be provided to the battery management system via electrical signals, for example due to a varied electrical resistance of the temperature sensor.

The temperature sensor comprises at least one spring element having a preferably linear spring constant. It is preferred that the spring element is configured so as to retract or extend along a straight line. A spring force thus always acts in the same direction irrespective of the extent to which the spring element is compressed. The spring element is mechanically connected to the sensor head. This means that a spring force that is stored in the spring element is transmitted to the sensor head. Consequently, the sensor head may be pressed against the measuring site by means of the spring element and its spring force. It is preferred that the spring force is of such a magnitude that it is possible to avoid the contact between the sensor head and the measuring site becoming released, for example due to mechanical vibrations while a motor vehicle is traveling. It is possible to provide in accordance with the invention that the spring element and the connection wires are different components.

In this case, it is preferred that the connection wires comprise at least one flexible or easily deformable part region in which the connection wires are configured for example in the form of a cable in order not to block a spring movement of the spring element nor to block a relative movability of the sensor head with respect to the battery management system.

The temperature sensor in accordance with the invention has the advantage that it may be produced and mounted using simple means and in a cost-effective manner, wherein it is possible by means of the spring element to press the sensor head in a linear manner against a measuring site within a battery system and thus a reliable measurement of the temperature may be ensured. Moreover, temperature sensors of this type having spring elements may be provided as standard components and may be used for differently configured battery systems, in particular when the installation space is greatly limited and also when the spacings between a battery unit and a battery management system of the battery system vary.

It is preferred that the spring element is formed at least in part from a twisted arrangement of at least two connection wires. In order to avoid a short circuit, it is preferred that at least one of the connection wires comprises an outer electrically insulating layer. By virtue of the twisted arrangement, the connection wires together form the spring element and comprise a geometric shape that has particularly favorable spring-elastic characteristics. Consequently, it is ensured in a simple and cost-effective manner that the sensor head of the temperature sensor may be pressed with a predetermined or sufficient pressing force against a measuring site within a battery system.

It is particularly preferred that the temperature sensor is configured as an NTC sensor. An NTC sensor comprises an electric internal resistance that reduces as the temperatures at the sensor head increase. Temperature sensors of this type may be produced using simple means and in a cost-effective manner and are well suited for measuring the temperature of battery units or battery cells, in particular of Li-ion battery units or cells.

In accordance with a second aspect of the invention, a battery system is provided for storing electrical energy and for supplying an electric motor of a motor vehicle with electrical energy. The battery system comprises a battery unit having at least one re-chargeable battery cell, a battery management system for monitoring the battery system and at least one temperature sensor for measuring a temperature of the at least one battery cell. The temperature sensor comprises a sensor head and connection wires that are electrically coupled to the sensor head. Moreover, the temperature sensor comprises at least one spring element that is mechanically connected to the sensor head and is attached to the battery management system in such a manner that the sensor head is pressed by the spring element against a measuring site of the at least one battery cell.

The battery system is preferably an intrinsically closed system that is encompassed or surrounded by way of example by a system housing so as to protect said battery system from external influences, such as for example mechanical loadings or moisture and said battery system comprises battery terminals for receiving or outputting electrical energy. The battery system is preferably configured for supplying an electric motor of a motor vehicle, such as for example a hybrid or electric vehicle, with electrical energy.

The battery unit comprises at least one re-chargeable battery cell, such as for example a Li-ion battery cell. It is preferred that the battery unit comprises a multiplicity of such battery cells that are connected or coupled to one another in series or in parallel, for example by means of known cell connectors for battery cells in order to provide a predetermined nominal voltage and nominal current strength of the battery unit. The battery management system is configured for monitoring the battery system.

In order to measure a temperature of the at least one battery cell, the battery system comprises at least one temperature sensor having a sensor head and connection wires that are electrically coupled to the sensor head. The sensor head is in contact with the measuring site of the battery system so as to measure the temperature. It is preferred that the battery system comprises multiple temperature sensors that are arranged spaced apart from one another in the battery system so as to measure temperatures of different measuring sites, in particular so as to determine temperatures of different battery cells. The connection wires are electrically coupled to the battery management system, in particular by means of a soldering procedure, in such a manner that temperatures that are recorded by the sensor head may be provided to the battery management system via electrical signals.

The temperature sensor comprises at least one spring element having a preferably linear spring constant. It is preferred that the spring element is configured for retracting and extending along a straight line. A spring force may thus always act in the same direction irrespective of the extent to which the spring element is compressed. The spring element is mechanically connected to the sensor head. This means that a spring force that is stored in the spring element is transmitted to the sensor head. Consequently, the sensor head is pressed by means of the spring element and its spring force against the measuring site. It is preferred that the spring force is of such a magnitude that it is possible to avoid the contact between the sensor head and the measuring site becoming released, for example due to mechanical vibrations when a motor vehicle is traveling. It is possible in accordance with the invention to provide that the spring element and the connection wires are different components. In this case, it is preferred that the connection wires comprise at least one flexible or easily deformable part region in which the connection wires are configured for example in the form of a cable in order not to block a spring movement of the spring element nor to block a relative movability of the sensor head with respect to the battery management system.

The battery system in accordance with the invention has the advantage that it may be mounted using simple means and in a cost-effective manner, wherein it is ensured by means of the spring element that the sensor head is pressed against a measuring site and that a measurement of the temperature is reliable. Moreover, temperature sensors of this type having spring elements may be provided as standard components and may be used for differently configured battery systems, in particular when the installation space is greatly limited and also when the spacings between the battery unit and battery management system vary.

In accordance with one preferred further development of the invention, it is possible to provide in the case of a battery system that at least one of the connection wires of the temperature sensor is configured at least in part as the spring element. When at least one connection wire is configured at least in part as a spring element, it is no longer necessary to provide a separate spring element for pressing the sensor head against the measuring site. It is preferred that all the connection wires are configured individually or jointly as a spring element. The connection wires that are configured as a spring element comprise preferably a material that has good spring-elastic and electrically conductive characteristics. It is possible to provide in accordance with the invention that a connection wire comprises multiple materials, wherein of the materials at least one first material comprises particularly good electrically conductive capabilities and a second material comprises particularly good spring-elastic characteristics. A temperature sensor of this type may be produced using simple means and in a cost-effective manner, in particular since additional components are not required.

It is preferred that in the case of a battery system in accordance with the invention at least two connection wires are twisted with one another. In order to avoid a short circuit, it is preferred that at least one of the connection wires comprises an outer electrically insulating layer. By virtue of the twisted arrangement, the connection wires together form the spring element and comprise a geometric shape that has particularly favorable spring-elastic characteristics. Consequently, it is possible to ensure in a simple and cost-effective manner that the sensor head of the temperature sensor is pressed with a predetermined or sufficient pressing force against the measuring site.

It is further preferred in the case of a battery system in accordance with the invention that the at least one spring element is configured as a type of helical spring and/or in a twisted manner. The term 'type of helical spring' is understood to mean in accordance with the invention a geometric shape that is configured in a helical manner about a central longitudinal axis. In so doing, it is preferred in accordance with the invention that a spacing between the spring element and the longitudinal axis is constant or remains essentially constant along the longitudinal axis. Such a spring element may be produced using simple means and in a cost-effective manner.

In accordance with one preferred further development of the invention, at least one measuring site of the battery unit is provided on a cell housing, a cell connector or a cell cover of the battery unit. Alternatively or in addition thereto, at least one measuring site may be configured directly on a battery cell. In the case of multiple measuring sites, it is preferred if the measuring sites are distributed uniformly or in an essentially uniform manner. The closer the measuring sites are to the battery cells, the more precise is the measurement of a temperature of the battery cells. Measuring sites of this type, in particular on the cell housing or cell cover, have the advantage that said measuring sites are directly adjacent to the battery management system.

It is possible in accordance with the invention that the connection wires are electrically coupled to a circuit board of the battery management system and/or are retained on a circuit board of the battery management system. It is preferred that the circuit board is configured for receiving further electronic components or modules of the battery management system. It is further preferred that the circuit board is arranged on a side of the battery management system facing the battery unit. It is preferred that the connection wires are retained on the circuit board via the electrical coupling, for example by means of a soldering or welding site. An arrangement of this type may be produced or mounted in a cost-effective manner and using simple means.

It is preferred in the case of the battery system in accordance with the invention that a sensor head is attached to a measuring site, in particular by means of an adhesive. Alternatively, it is possible to attach the sensor head to the measuring site also via other known means, for example a soldering and/or welding site, clamping connection or the like. An arrangement of this type whereby the sensor head is attached to the measuring site has the advantage that the sensor head is secured using simple means and in a cost-effective manner against unintentionally lifting off the measuring site. A particularly reliable measurement of the temperature is ensured in this manner.

In accordance with one preferred embodiment of the invention, the battery unit in the case of a battery system may comprise at the measuring site a first contact surface that corresponds with a second contact surface of the sensor head in such a manner that a common contact surface is formed on the battery unit and the sensor head. This means that the first contact surface and the second contact surface are configured by way of example in a plate-shaped or planar manner. Alternatively, the first contact surface is configured by way of example in a concave manner and the second contact surface is configured in a convex manner with a corresponding radius of curvature. Consequently, it is ensured using simple means and in a cost-effective manner that the first contact surface and the second contact surface comprise a large as possible common contact surface. As a result, it is ensured that heat is transferred efficiently and consequently that the measurement of the temperature at the measuring site is particularly reliable.

All the advantages that are mentioned with regard to the temperature sensor in accordance with the first aspect of the invention naturally also apply for the battery system in accordance with the second aspect of the invention.

In accordance with a third aspect of the invention, a method is provided for mounting a battery system in accordance with the invention. The method comprises the following steps:

providing a battery unit having at least one battery cell,
providing a battery management system for monitoring the battery system,
electrically coupling and mechanically attaching a connection wire of a temperature sensor to the battery management system, and
arranging the battery management system relative to the battery unit in such a manner that a sensor head that is remote from the battery management system and is part of the temperature sensor is pressed by at least one spring element of the temperature sensor against a measuring site of the battery unit.

It is preferred that one battery unit is provided that comprises multiple battery cells that are connected to one another in series and/or in parallel. It is preferred that the battery unit comprises a cell housing that surrounds the battery cells. The battery management system comprises a connection site for connecting or electrically coupling the connection wires of the at least one temperature sensor. The electrical coupling is preferably produced by means of a soldering procedure, welding procedure or a plugging-in procedure. The mechanical attachment is preferably produced by means of the electrical coupling. As the battery management system is being arranged on the battery unit, the spring element is compressed in such a manner that a preferably predefined or essentially predefined spring force is built up that presses the sensor head against the measuring site and consequently hinders or prevents the sensor head from lifting off the measuring site. It is preferred that the sensor head is attached to the measuring site via further means, such as for example by means of an adhesive. It is possible using the method in accordance with the invention to mount a battery system using simple means and in a cost-effective manner, wherein it is ensured that the sensor head is held against the measuring site. Moreover, the method in accordance with the invention has all the advantages that have already been described in connection with the battery system in accordance with the invention in accordance with the second aspect of the invention.

BRIEF DESCRIPTION OF THE DRAWINGS

Preferred embodiments of the battery system in accordance with the invention are further explained below with the aid of drawings. In the individual drawings.

DETAILED DESCRIPTION

Figure 1:
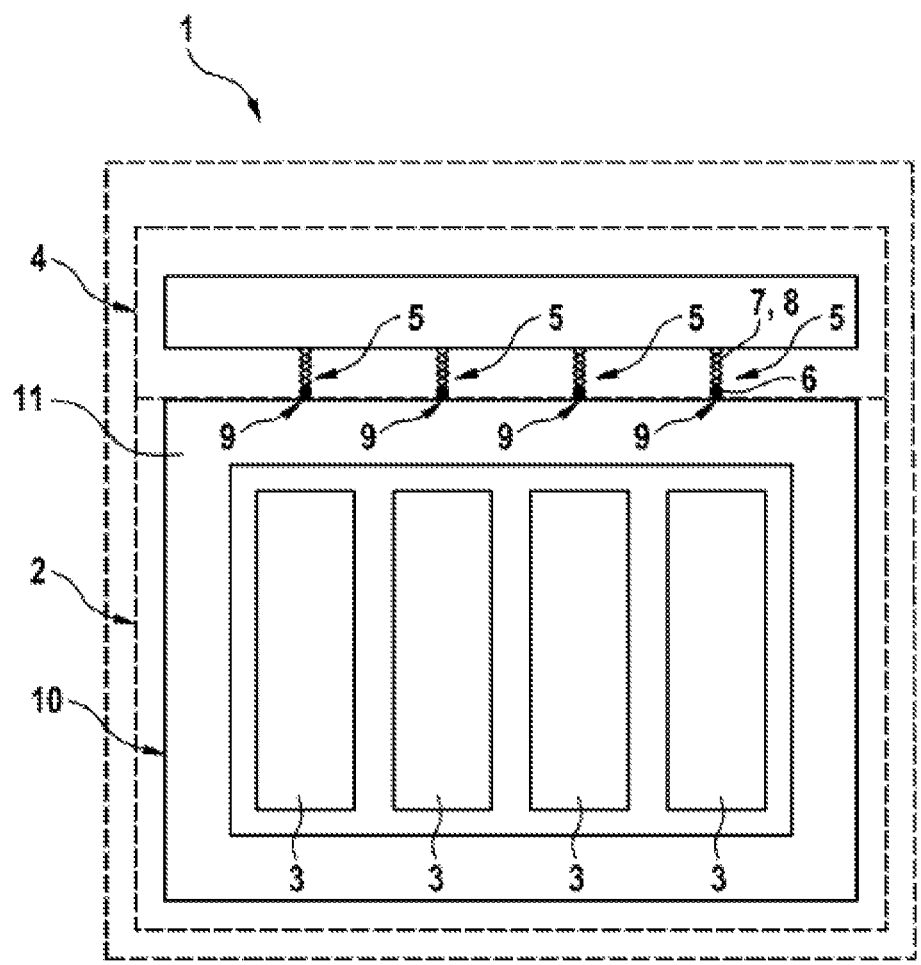
FIG. 1 illustrates schematically a side view of a preferred embodiment of a battery system in accordance with the invention.

FIG. 1 illustrates schematically a side view of a preferred embodiment of a battery system 1 in accordance with the invention. The battery system 1 comprises a battery unit 2 having multiple battery cells 3 that are connected to one another, and a battery management system 4 for monitoring the battery system 1. The battery unit 2 comprises a cell housing 10 having a cell cover 11. Multiple temperature sensors 5 having a sensor head 6 and two connection wires 7 that are configured as a spring element 8 are arranged between the battery management system 4 and the cell cover 11. The spring elements 8 are compressed in such a manner that the sensor heads 6 are pressed by means of a predefined force against the measuring sites 9 on the cell cover 11. Consequently, a reliable measurement of the temperatures at the measuring sites 9 is ensured.

Figure 2A:
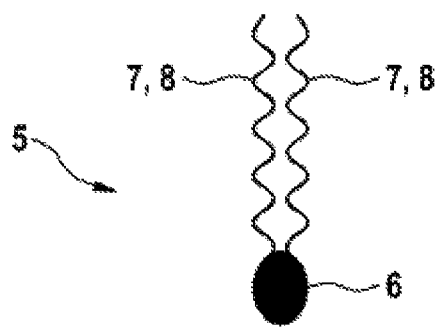
FIG. 2a illustrates schematically a side view of a first embodiment of a temperature sensor.

FIG. 2a illustrates schematically a side view of a first embodiment of a temperature sensor 5 in accordance with the invention. The temperature sensor 5 comprises a sensor head 6, which has an oval longitudinal section, and two connections wires 7, which are arranged adjacent to one another and are electrically coupled to the sensor head 6 and are each configured as spring elements 8 that are twisted separately from one another.

Figure 2B:
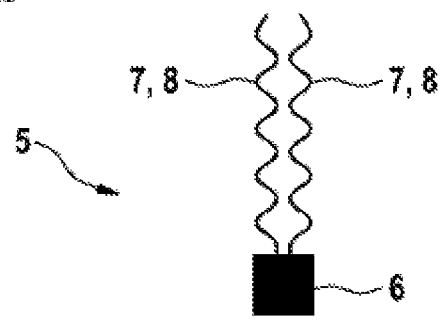
FIG. 2b illustrates schematically a side view of a second embodiment of a temperature sensor.

The second embodiment of a temperature sensor 5 in accordance with the invention and illustrated schematically in a side view in FIG. 2b comprises a sensor head 6, which has a rectangular or square longitudinal section, and two connection wires 7, which are arranged adjacent to one another and are electrically coupled to the sensor head 6 and are each configured as spring elements 8 that are twisted separately from one another.

Figure 2C:
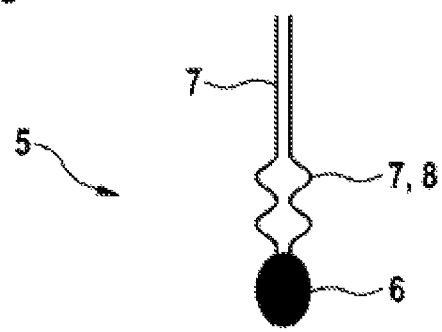
FIG. 2c illustrates schematically a side view of a third embodiment of a temperature sensor.

The third embodiment of a temperature sensor 5 in accordance with the invention is illustrated schematically in a side view in FIG. 2c. The temperature sensor 5 comprises a sensor head 6, which has an oval longitudinal section, and two connection wires 7, which are arranged adjacent to one another and are electrically coupled to the sensor head 6. The connection wires 7 are each configured in a region that is adjacent to the sensor head 6 as twisted spring elements 8. It is naturally possible in accordance with the invention that a sensor head 6 in this embodiment may also have a rectangular or square longitudinal section.

Figure 3A:
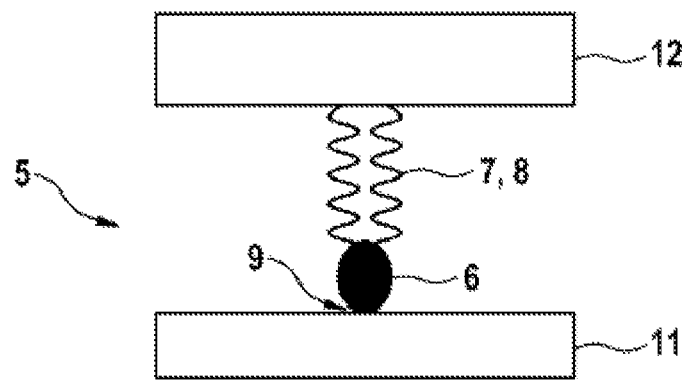
FIG. 3a illustrates schematically a side view of a sensor arrangement with the temperature sensor shown in FIG. 2a, and FIG. 3b illustrates schematically a side view of a sensor arrangement with the temperature sensor shown in FIG. 2b.

FIG. 3a illustrates schematically a side view of a sensor arrangement having a temperature sensor 5 in accordance with the first embodiment. Ends that are remote from the sensor head 6, which has an oval longitudinal section, and are part of the connection wires 7, which are twisted separately and arranged adjacent to one another parallel with the spring elements 8, are electrically coupled to a circuit board 12 of a battery management system 4, which is not further illustrated, and consequently held mechanically against the circuit board 12. The sensor head 6 lies against a measuring site 9 of a cell cover 11 of the battery unit 2 that is not further illustrated. The spring element 8 is compressed in such a manner that the sensor head 6 is pressed against the measuring site 9 with a defined or essentially defined force.

Figure 3B:
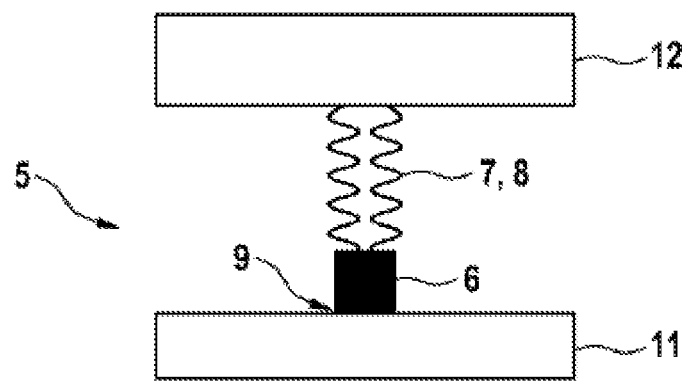

FIG. 3b illustrates schematically a side view of a sensor arrangement having a temperature sensor 5 in accordance with the second embodiment. Ends that are remote from the sensor head 6, which has a rectangular or square longitudinal section, and are part of the connection wires 7, which are twisted separately and arranged adjacent to one another parallel with the spring elements 8, are electrically coupled to a circuit board 12 of a battery management system 4, which is not further illustrated, and consequently held mechanically against the circuit board 12. The sensor head 6 lies against a measuring site 9 of a cell cover 11 of the battery unit 2 that is not further illustrated. The spring element 8 is compressed in such a manner that the sensor head 6 is pressed against the measuring site 9 with a defined or essentially defined force. The sensor head 6 in accordance with the second embodiment comprises a greater common contact surface with the cell cover 11 than the sensor head 6 that is illustrated in FIG. 3a and is in accordance with a first embodiment.

What is claimed is:

1. A battery system (1) for storing electrical energy and for supplying an electric motor of a motor vehicle with electrical energy, the battery system (1) comprising a battery unit (2) having at least one battery cell (3) and a temperature sensor (5) for measuring a temperature of the at least one battery cell (3), said temperature sensor (5) comprising a sensor head (6) and connection wires (7) that are electrically connected to the sensor head (6), wherein at least one of the connection wires (7) is configured at least in part as a spring element (8) or forms at least one part of a spring element (8), wherein the spring element (8) is configured in the shape of a helical spring or in a twisted manner, and wherein the sensor head (6) is pressed by the spring element (8) against a measuring site (9) of the at least one battery cell (3).

2. The battery system (1) as claimed in claim 1, characterized in that the spring element (8) is formed at least in part from a twisted arrangement of at least two connection wires (7).

3. The battery system (1) as claimed in claim 1, characterized in that the temperature sensor (5) is configured as an NTC sensor.

4. A battery system (1) for storing electrical energy and for supplying an electric motor of a motor vehicle with electrical energy, said battery system comprising a battery unit (2) having at least one re-chargeable battery cell (3), a battery management system (4) for monitoring the battery system (1) and at least one temperature sensor (5) for measuring a temperature of the at least one battery cell (3), wherein the temperature sensor (5) comprises a sensor head (6) and connection wires (7) that are electrically coupled to the sensor head (6), characterized in that the temperature sensor (5) comprises at least one spring element (8) that is mechanically connected to the sensor head (6) and is attached to the battery management system (4) in such a manner that the sensor head (6) is pressed by the spring element (8) against a measuring site (9) of the at least one battery cell (3).

5. The battery system (1) as claimed in claim 4, characterized in that the temperature sensor (5) comprises a sensor head (6) and connection wires (7) that are electrically connected to the sensor head, characterized in that at least one of the connection wires (7) is configured at least in part as a spring element (8) or forms at least one part of a spring element (8), wherein the spring element (8) is configured in the shape of a helical spring or in a twisted manner.

6. The battery system (1) as claimed in claim 4, characterized in that at least one measuring site (9) of the battery unit (2) is provided on a cell housing (10), a cell connector or a cell cover (11) of the battery unit (2).

7. The battery system (1) as claimed in claim 4, characterized in that the connection wires are electrically coupled to a circuit board (12) of the battery management system (4) and/or are held against a circuit board (12) of the battery management system (4).

8. The battery system (1) as claimed in claim 4, characterized in that the sensor head (6) is attached to the measuring site (9).

9. The battery system (1) as claimed in claim 4, characterized in that the battery unit (2) comprises at the measuring site (9) a first contact surface that corresponds with a second contact surface of the sensor head (6) in such a manner that a common contact surface is formed on the battery unit (2) and the sensor head (6).

10. A method for mounting the battery system (1) as claimed in claim 1, said method comprising the steps:
providing the battery unit (2) having the at least one battery cell (3),
providing a battery management system (4) for monitoring the battery system (1),
electrically coupling and mechanically attaching the connection wires (7) of the temperature sensor (5) to the battery management system (4), and
arranging the battery management system (4) in such a manner relative to the battery unit (2) that the sensor head (6) that is remote from the battery management system (4) and is part of the temperature sensor (5) is pressed by the spring element (8) of the temperature sensor (5) against the measuring site (9) of the battery unit (2).

11. The battery system (1) as claimed in claim 4, characterized in that the sensor head (6) is attached to the measuring site (9) by an adhesive.

* * * * *